United States Patent
Shih (10) Patent No.: US 11,175,588 B2
(45) Date of Patent: Nov. 16, 2021

(54) ADDITIVE MANUFACTURING APPARATUS

(71) Applicant: NATIONAL CHUNG-HSING UNIVERSITY, Taichung (TW)

(72) Inventor: Hsi-Fu Shih, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 301 days.

(21) Appl. No.: 16/139,554

(22) Filed: Sep. 24, 2018

(65) Prior Publication Data

US 2019/0101833 A1    Apr. 4, 2019

(30) Foreign Application Priority Data

Sep. 29, 2017 (TW) ................................. 106133811

(51) Int. Cl.
  *G03F 7/20* (2006.01)
  *G03F 7/00* (2006.01)
  *B33Y 10/00* (2015.01)
  *B29C 64/245* (2017.01)
  *B33Y 30/00* (2015.01)
  (Continued)

(52) U.S. Cl.
  CPC ........ *G03F 7/70416* (2013.01); *B29C 64/135* (2017.08); *B29C 64/241* (2017.08); *B29C 64/245* (2017.08); *B29C 64/268* (2017.08); *B33Y 10/00* (2014.12); *B33Y 30/00* (2014.12); *G03F 7/0037* (2013.01)

(58) Field of Classification Search
  CPC ....... B33Y 10/00; B33Y 30/00; B29C 64/245; B29C 64/241; B29C 64/135; B29C 64/268; G03F 7/0037

USPC .......................................................... 264/401
See application file for complete search history.

(56) References Cited

U.S. PATENT DOCUMENTS 6,211,511 B1 * 4/2001 Shih ........................ G11B 7/139
                                                        250/214 R
2004/0246874 A1   12/2004 Takagi et al.
(Continued)

FOREIGN PATENT DOCUMENTS

CN       105829113 A     8/2016
WO   WO 2016/164390 A1   10/2016
WO   WO 2017/154564 A1   9/2017

OTHER PUBLICATIONS

Taiwanese Search Report for Taiwanese Application No. 106133811, dated May 17, 2019, with English translation.
(Continued)

*Primary Examiner* — Matthew J Daniels
*Assistant Examiner* — Gregory C. Grosso
(74) *Attorney, Agent, or Firm* — Birch, Stewart, Kolasch & Birch, LLP (57) ABSTRACT

An additive manufacturing apparatus is adapted to produce a solid object from a liquid resin and includes a vat, a lifting platform, an optical pickup head, and a planar scanning module mounted with the optical pickup head and operable to move the optical pickup head on a two-dimensional plane. The optical pickup head includes a focusing unit that has a first laser source for producing a laser beam, at least one first objective lens, and a first collimator lens disposed between the first laser source and the at least one first objective lens, such that the laser beam passes through the first collimator lens and the at least one first objective lens to strike and cure the liquid resin during movement of the lifting platform away from the vat.

10 Claims, 9 Drawing Sheets

(51) Int. Cl.
    *B29C 64/241*    (2017.01)
    *B29C 64/135*    (2017.01)
    *B29C 64/268*    (2017.01)

(56) References Cited

U.S. PATENT DOCUMENTS

| | | | | |
|---|---|---|---|---|
| 2005/0046946 A1* | 3/2005 | Mori | ................... | G02B 5/1852 |
| | | | | 359/569 |
| 2012/0092632 A1* | 4/2012 | McLeod | ................ | G03F 7/095 |
| | | | | 355/53 |
| 2014/0265040 A1* | 9/2014 | Batchelder | .............. | G01F 1/661 |
| | | | | 264/409 |
| 2016/0236279 A1* | 8/2016 | Ashton | ................... | B22F 10/00 |
| 2016/0368210 A1* | 12/2016 | Chen | ..................... | B29C 64/106 |

OTHER PUBLICATIONS

Taiwanese Search Report, dated Jan. 3, 2019, for Taiwanese Application No. 106133811, with English translation.

* cited by examiner

ADDITIVE MANUFACTURING APPARATUS

CROSS-REFERENCE TO RELATED APPLICATION

This application claims priority of Taiwanese Patent Application No. 106133811, filed on Sep. 29, 2017.

FIELD

The disclosure relates to an additive manufacturing apparatus, more particularly to an additive manufacturing apparatus using a vat photo-polymerization process.

BACKGROUND

In recent years, there has been a rise in additive manufacturing (AM) technology. Being faster and more convenient than traditional manufacturing processes, where molds must be made or where multiple processing is involved, additive manufacturing has contributed to the development of the so-called "maker culture", and is being applied in a large range of sectors.

The American Society for Testing and Materials (ASTM) classifies additive manufacturing processes into seven categories: vat photo-polymerization (VP), material jetting (MJ), binder jetting (BJ), material extrusion (ME), powder bed fusion (PBF), sheet lamination (SL) and directed energy deposition (DED). In particular, material extrusion processes, which use thermoplastics such as acrylonitrile butadiene styrene (ABS), have been the more successful and more widely used processes. However, as material extrusion often involves a rod of the raw material being drawn through a nozzle and heated, then deposited layer by layer to form the finished product, the structural resolution of the finished product is limited by the width of the rod and the structure of the nozzle. Thus, in recent years, vat photo-polymerization processes, whose finished products can be more detailed, have shown potential of replacing material extrusion processes.

Vat photo-polymerization processes were first disclosed in U.S. Pat. No. 4,575,330, where a stereo-lithography apparatus (SLA) was provided. In vat photo-polymerization processes, a liquid photo-polymerizing resin is disposed in a vat, and then a laser beam performs stereo-lithography on the resin by scanning the resin point-by-point to cure a layer of the resin, which is then moved, on a lifting platform, in a direction away from the vat. The aforementioned process is then repeated to build the solid object layer by layer. However, because of limitations due to the scanning distance, the spot size and the depth of focus of the laser beam cannot be effectively reduced.

Another method uses, for example, an incoherent blue light emitting diode (LED) as a light source with a digital light processor based (DLP-based) projector. The three dimensional structure of the desired final product is sliced into planar cross sections that are projected, using the projector, sequentially onto the liquid resin, forming the solid object layer by layer. The cured resin layers are then moved using the lifting platform in a direction away from the liquid resin. As the projector cures an entire layer of the resin at once, this method is faster relative to the aforementioned point-by-point scanning method. However, due to effects of optical diffraction, the optical resolution of the projection and thus the structural resolution of the solid object are limited.

Even though current vat photo-polymerization processes are able to provide structurally detailed products relative to other processes, their precision is still limited by the optical resolution of light source used.

SUMMARY

Therefore, an object of the disclosure is to provide an additive manufacturing apparatus that can alleviate at least one of the drawbacks of the prior art.

According to the disclosure, the additive manufacturing apparatus is adapted to produce a solid object from a liquid resin, and includes a vat adapted for containing the liquid resin, a lifting platform adapted to be dipped into the liquid resin and to serve as a base on which the solid object is cumulatively formed, a linear conveying module connected to the lifting platform for moving the lifting platform vertically away from the vat, an optical pickup head spaced apart from the vat and disposed at a side of the vat opposite to the lifting platform, and a planar scanning module mounted with the optical pickup head and operable to move the optical pickup head on a two-dimensional plane.

The optical pickup head includes a focusing unit that has a first laser source for producing a laser beam, at least one first objective lens spaced apart from the first laser source, and a first collimator lens. The first collimator lens is disposed between the first laser source and the at least one first objective lens, such that the laser beam passes through the first collimator lens and the at least one first objective lens to strike the liquid resin and cure the liquid resin during a vertical movement of the lifting platform away from the vat.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the present invention is described in greater detail, it should be noted that where considered appropriate, reference numerals or terminal portions of reference numerals have been repeated among the figures to indicate corresponding or analogous elements, which may optionally have similar characteristics.

Figure 1:
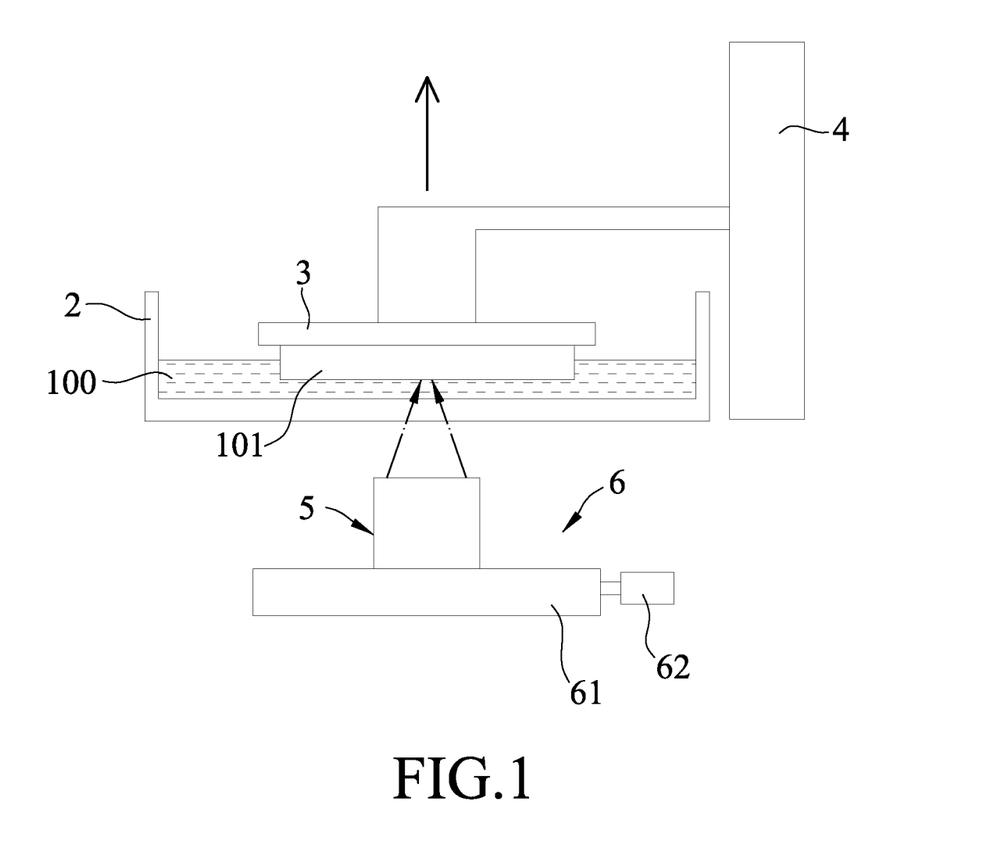
FIG. 1 is a schematic view of a first embodiment of an additive manufacturing apparatus according to the disclosure.
Figure 2:
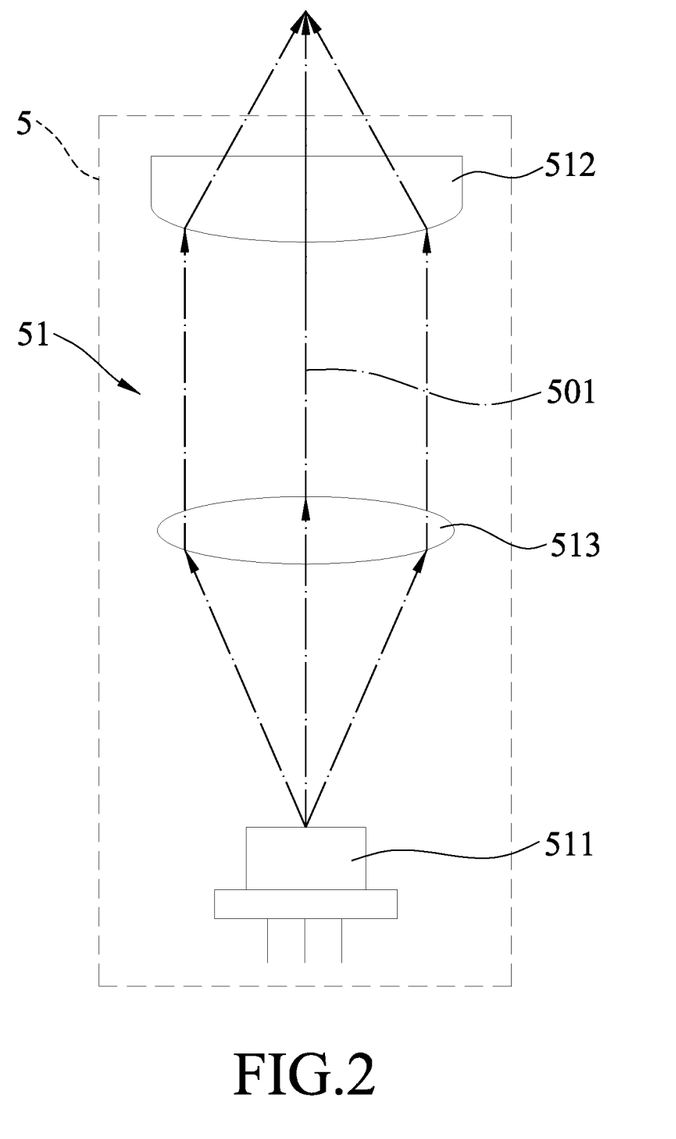
FIG. 2 is a schematic view of an optical pickup head of the first embodiment.
Figure 3:
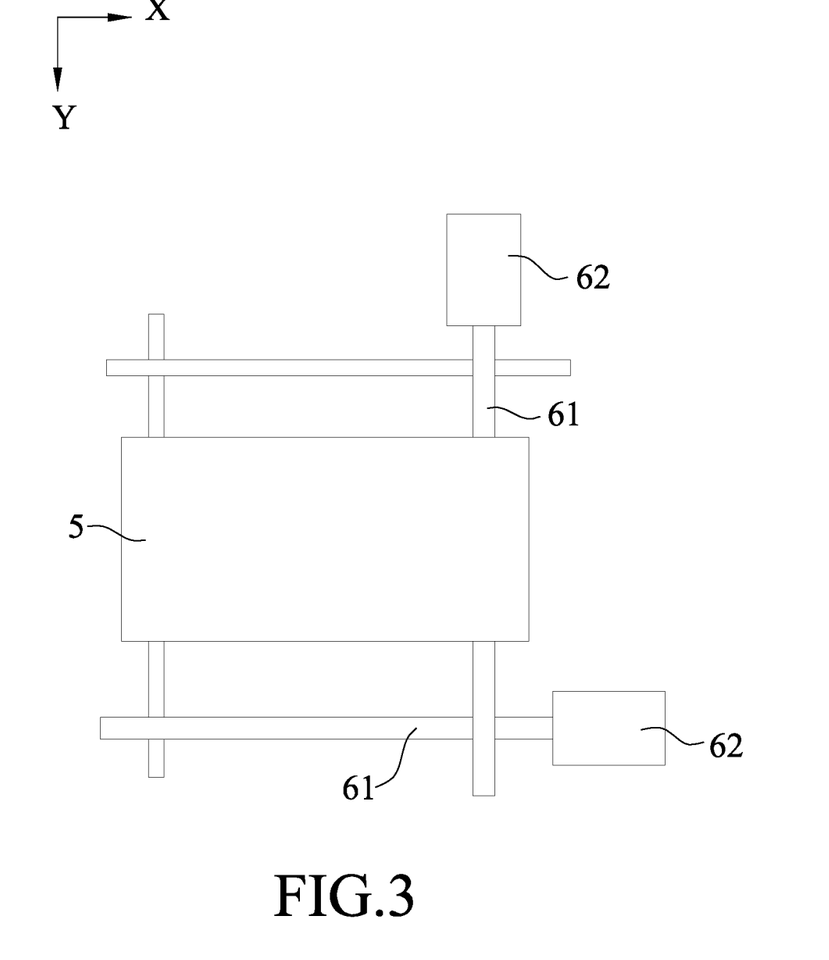
FIG. 3 is a schematic top view of a planar scanning module of the first embodiment.

Referring to FIGS. 1 to 3, a first embodiment of an additive manufacturing apparatus according to the disclosure is adapted to produce a solid object 101 from a liquid photo-polymerizing resin 100. The additive manufacturing apparatus includes a vat 2 adapted for containing the liquid resin 100, a lifting platform 3 adapted to be dipped into the liquid resin 100 and to serve as a base on which the solid object 101 is cumulatively formed, a linear conveying module 4, an optical pickup head 5 spaced apart from the vat 2, and a planar scanning module 6 operable to move the optical pickup head 5 on a two-dimensional plane.

The linear conveying module 4 is connected to the lifting platform 3 for moving the lifting platform 3 vertically away from the vat 2. In this embodiment, the optical pickup head 5 is disposed at a side of the vat opposite the lifting platform 3, and includes a focusing unit 51 that has a first laser source 511 for producing a laser beam along a first optical path 501, a first objective lens 512 disposed on the first optical path 501 and spaced apart from the first laser source 511, and a first collimator lens 513 disposed on the first optical path 501 and between the first laser source 511 and the first objective lens 512, such that the laser beam passes through the first collimator lens 513 and the first objective lens 512 to strike the liquid resin 100 and cure the liquid resin 100 during a vertical movement of the lifting platform 3 away from the vat 2.

In other words, as the linear conveying module 4 incrementally pulls the lifting platform 3 away from the vat 2, the optical pickup head 5 works with the planar scanning module 6 to scan the liquid resin 100 in the two-dimensional plane, curing the liquid resin 100 and forming the solid object 101.

The optical pickup head 5 of this embodiment is a conventional blue-light optical pickup head that has a small laser spot size and whose beam splitter and condensing lens may be omitted. The first objective lens 512 and the first collimator lens 513 of the optical pickup head 5 focuses the laser beam such that the laser beam has small spot size, which allows the laser beam to have much higher optical resolution compared with the vertical and horizontal resolutions of conventional vat photo-polymerization processes. As a result, higher structural resolution of the solid object 101 can be achieved. A numerical aperture (NA) of the first objective lens 512 may be selected based on the structural resolution required of the solid object 101. In this embodiment, the numerical aperture of the first objective lens 512 may range between 0.1 and 0.85. Furthermore, a wavelength of the laser beam produced by the first laser source 511 is selected depending on a wavelength the liquid resin 100 is sensitive to. In this embodiment, the wavelength of the laser beam may range between 400 nanometers and 500 nanometers.

In particular, since the optical pickup head 5 is the conventional blue-light optical pickup head, each layer formed from curing of the liquid resin 100 has a thickness equal to the depth of focus (DOF) of a focused beam of blue light, which is approximately 200 nanometers. In order to achieve this level of precision as each layer of the solid object 101 is cured by the optical pickup head 5 from the liquid resin 100, a drive motor of the linear conveying module 4 may be a piezoelectric transducer (PZT).

In this embodiment, the planar scanning module 6 is operable to move the optical pickup head 5 on the two-dimensional plane to scan in an orthogonal coordinate system. Specifically, the planar scanning module 6 includes two transmission shafts 61 and two transmission motors 62 respectively connected to the two transmission shafts 61. The two transmission motors 62 are operable to move the two transmission shafts 61 in mutually perpendicular directions, respectively. In other words, one of the transmission motor 62 moves the respective transmission shaft in an X axis (X) and the other moves the respective transmission shaft in a Y axis (Y) (see FIG. 3), such that the optical pickup head 5 mounted on the planar scanning module 6 may be moved in the X axis (X) and the Y axis (Y).

Figure 4:
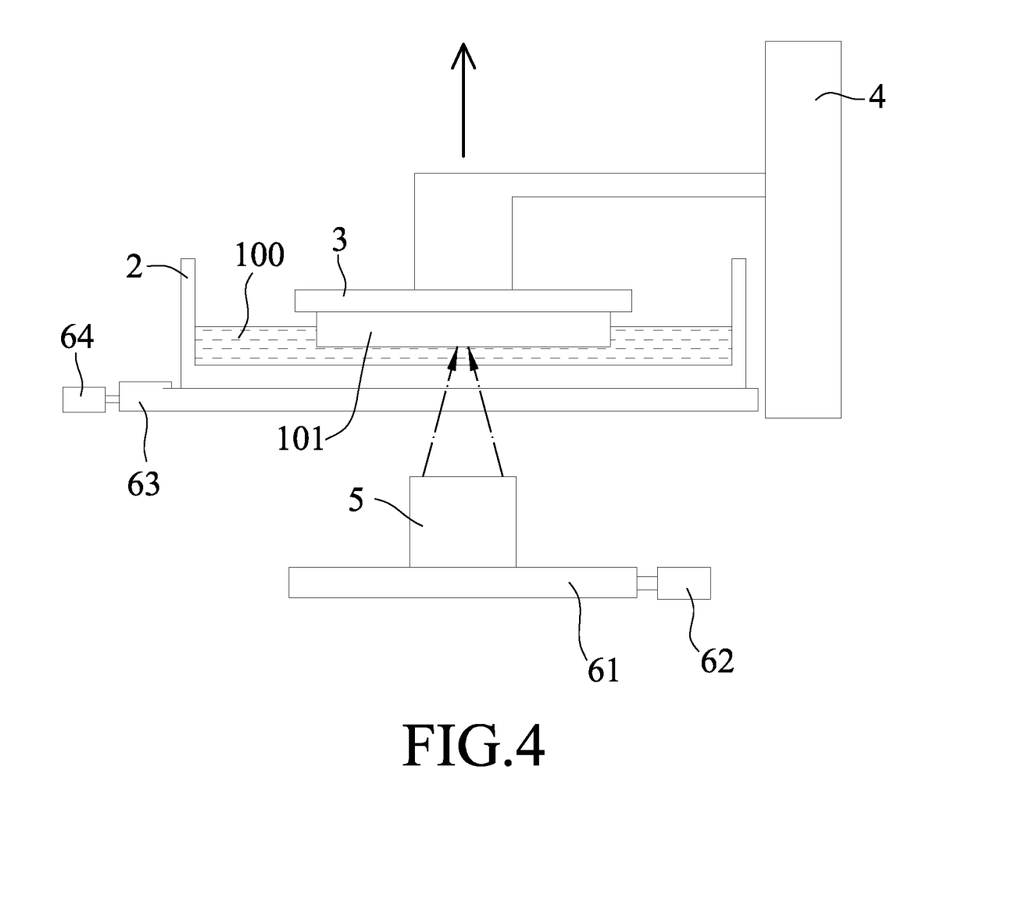
FIG. 4 is a schematic view of the first embodiment equipped with a variation of the planar scanning module.
Figure 5:
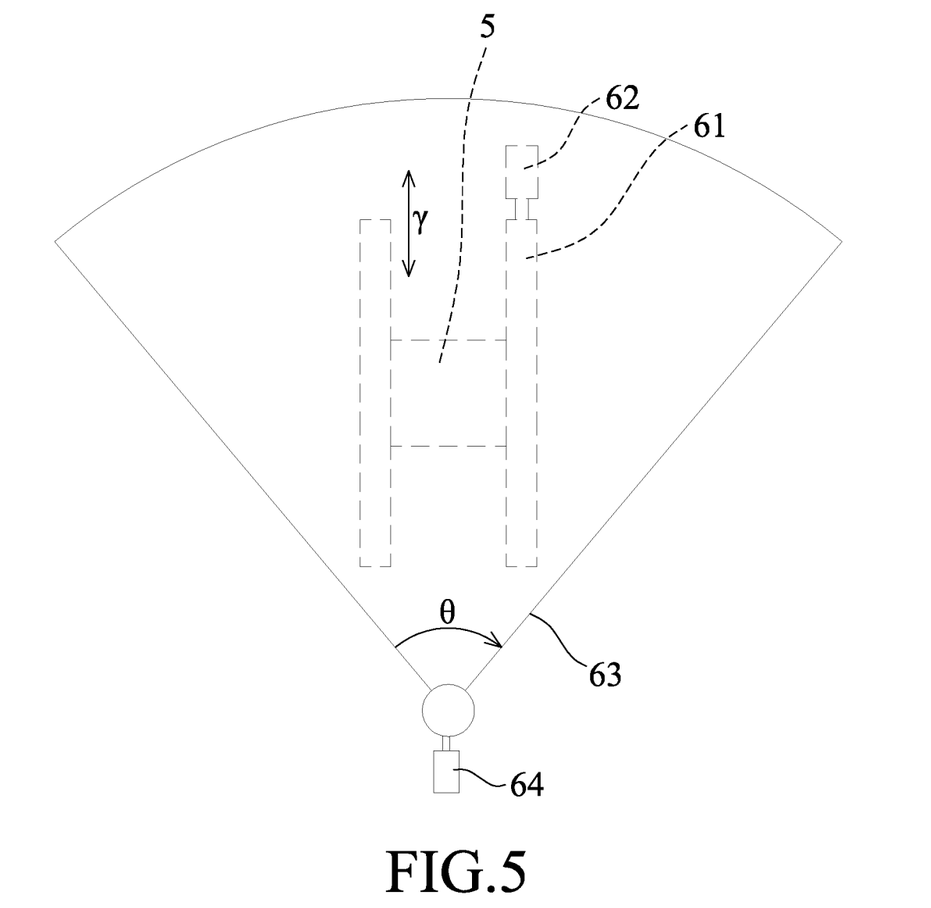
FIG. 5 is a schematic top view of the variation of the planar scanning module.

The structure of the planar scanning module 6 is not limited to employing the two transmission shafts 61. For example, as shown in FIGS. 4 and 5, a variation of the planar scanning module 6 may allow the optical pickup head 5 to scan in a polar coordinate system instead. Specifically, the planar scanning module 6 may instead include a rotary platform 63 mounted with the vat 2, a rotary motor 64 connected to the rotary platform 63, one transmission shaft 61 mounted with the optical pickup head 5, and one transmission motor 62 connected to the transmission shaft 61. The rotary motor 64 is operable to move the rotary platform 63 in an angular direction (θ), while the transmission motor 62 is operable to move the transmission shaft 61 in a linear direction (γ). In other words, by mounting the vat 2 to the rotary platform 63 and the optical pickup head 5 to the transmission shaft 61, the laser beam is allowed to scan in the polar coordinate system relative to the liquid resin 100 in the vat 2.

Figure 6:
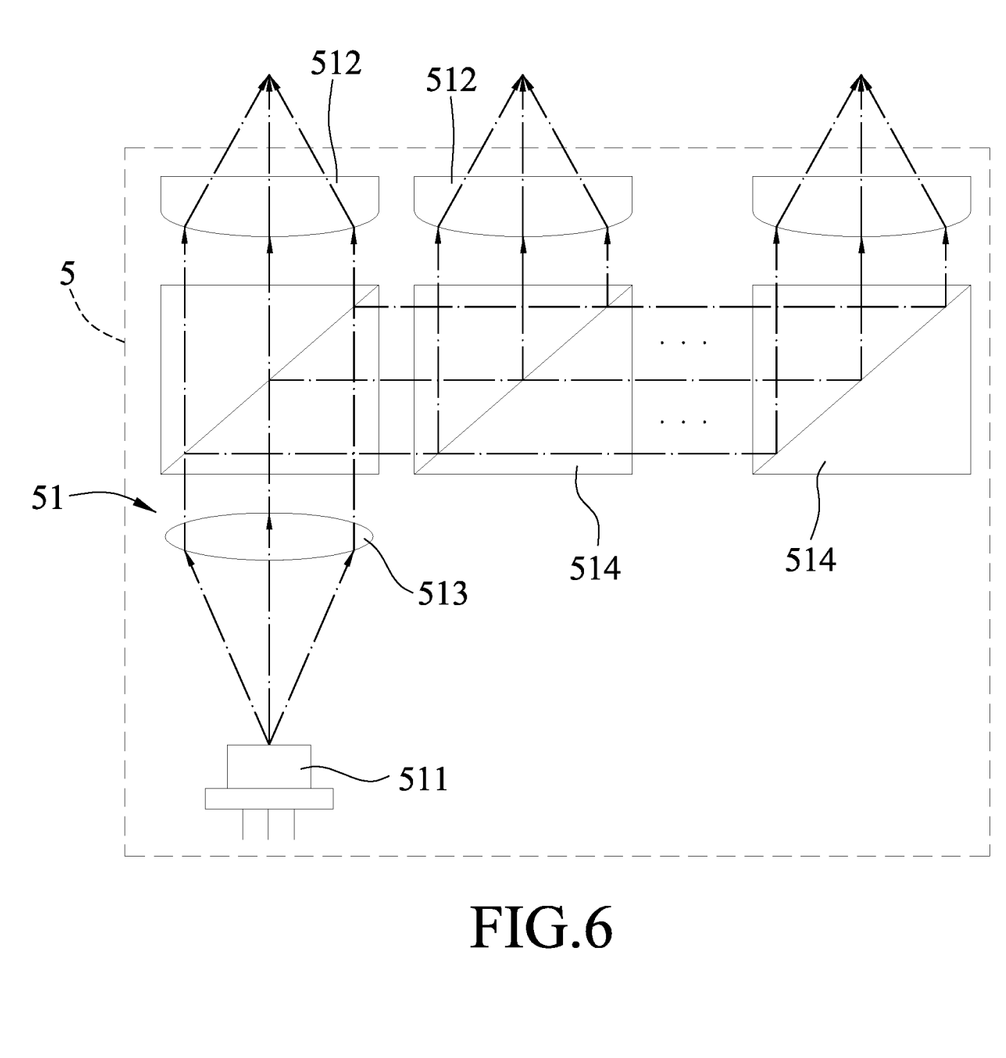
FIG. 6 is a schematic view of an optical pickup head of a second embodiment of an additive manufacturing apparatus according to the disclosure.

Referring to FIGS. 1 and 6, a second embodiment of an additive manufacturing apparatus according to the disclosure has a structure similar to that of the first embodiment. The difference between the first embodiment and the second embodiment resides in the structure of the focusing unit 51 of the optical pickup head 5. Specifically, the focusing unit 51 includes a plurality of the first objective lenses 512, and a plurality of first beam splitters 514 aligned respectively with the first objective lenses 512 and disposed between the first collimator lens 513 and the first objective lenses 512. The laser beam produced by the first laser source 511 is split at each first beam splitters 514 and transmits along a plurality of split optical paths to a corresponding one of the first objective lenses 512. As such, the curing of the liquid resin 100 may be done by a plurality of split laser beams simultaneously, shortening the production time of the solid object 101.

Although in this embodiment, the optical pickup head 5 employs only one laser source 511 and multiple first beam splitters 514 to produce multiple laser beams for striking the liquid resin 100, the optical pickup head 5 may include, in other embodiments, a plurality of the focusing unit 51 each having one first laser source 511 so that multiple laser beams can be provided simultaneously.

Figure 7:
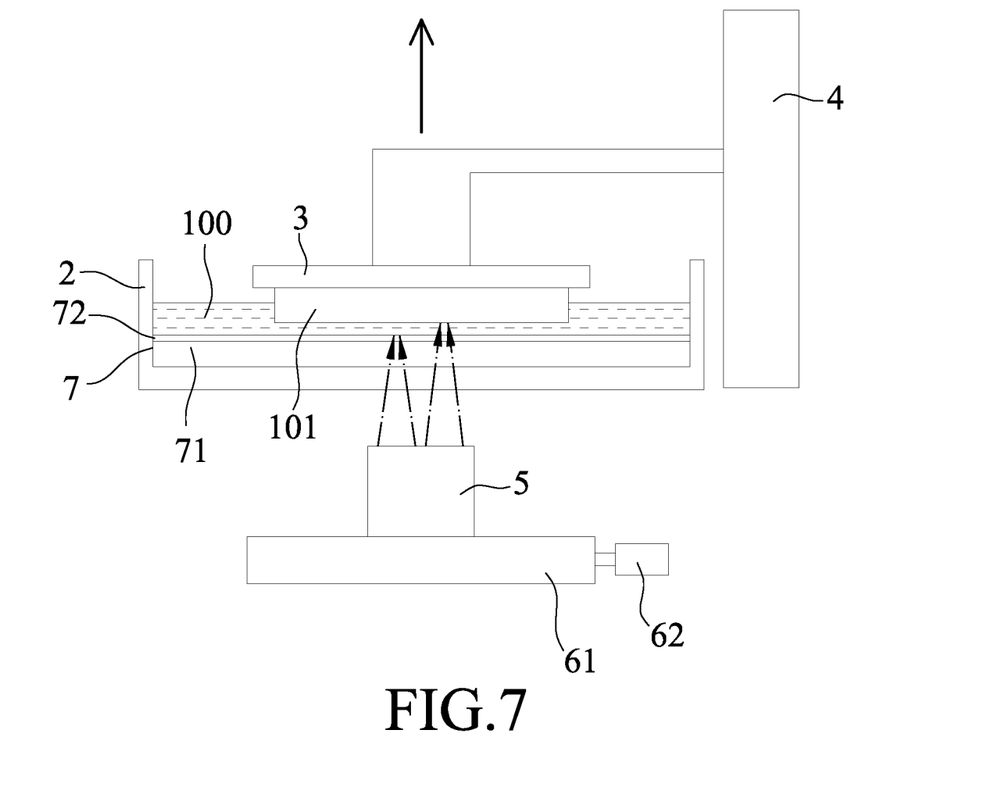
FIG. 7 is a schematic view of a third embodiment of an additive manufacturing apparatus according to the disclosure.
Figure 8:
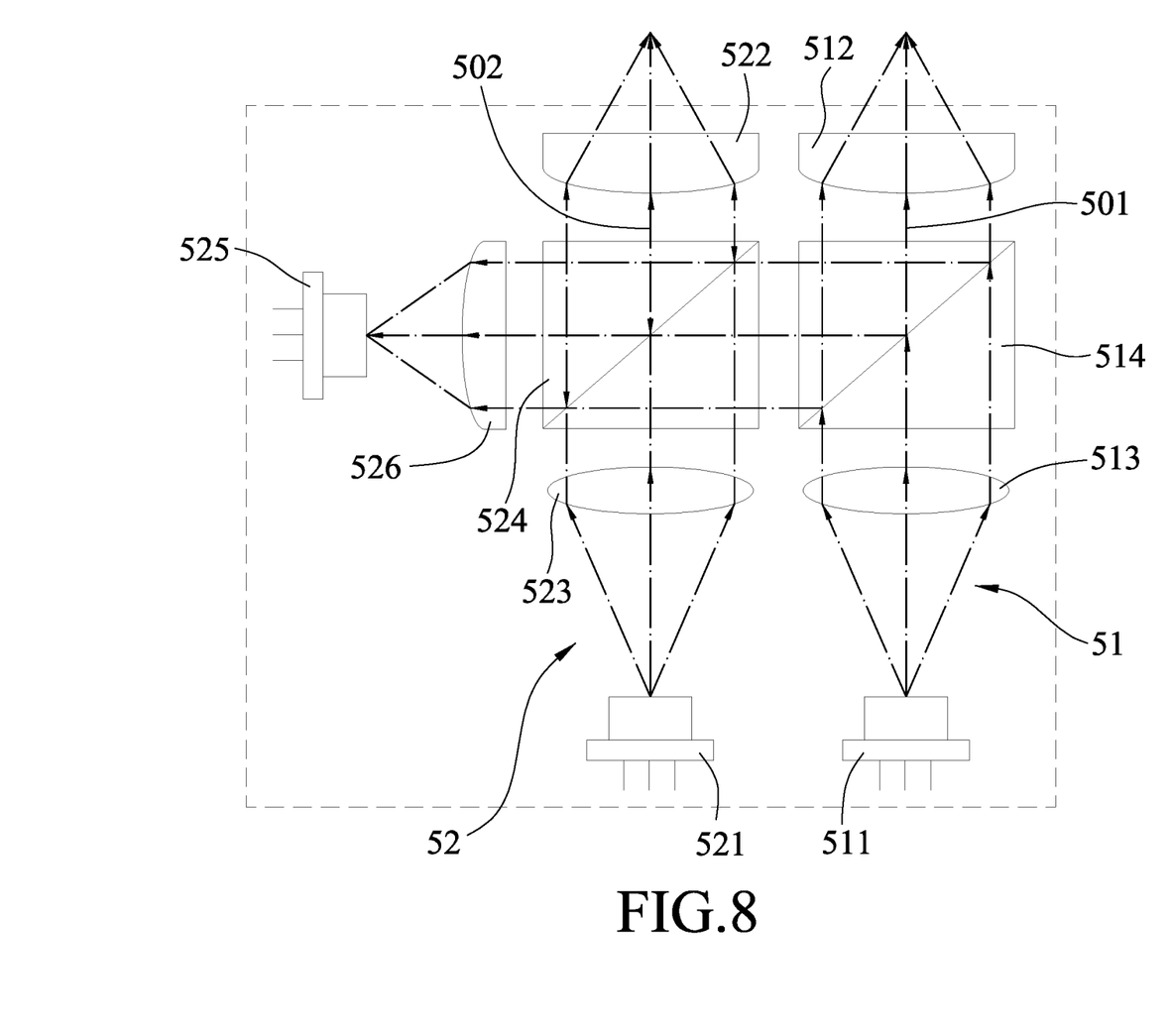
FIG. 8 is a schematic view of the optical pickup head of the third embodiment.

Referring to FIGS. 7 and 8, a third embodiment of an additive manufacturing apparatus according to the disclosure has a structure similar to that of the first embodiment. The differences between the first embodiment and the third embodiment are that the additive manufacturing device further includes a reflector 7 disposed at a bottom of the vat 2, that the optical pickup head 5 further includes a detecting unit 52, and that the focusing unit 51 has a different structure. The reflector 7 includes a base 71 and a dichroic filter 72 that is disposed on the base 71. The detecting unit 52 is proximate to the focusing unit 51 and has a second laser source 521 that is for producing a laser beam along a second optical path 502, a second objective lens 522 that is disposed on the second optical path 502 and that is spaced apart from the second laser source 521, a second collimator lens 523 that is disposed between the second laser source 521 and the second objective lens 522, a second beam splitter 524 that is disposed between the second objective lens 522 and the second collimator lens 523, a photo detector 525 that is spaced apart from the second objective lens 522, and a condensing lens 526 that is disposed between the second beam splitter 524 and the photo detector 525. The focusing unit 51 further includes a first beam splitter 514 disposed on the first optical path 501 and between the first collimator lens 513 and the first objective lens 512.

In this embodiment, the laser beams produced by the first and second laser sources 511, 521 have different wavelengths. The laser beam produced by the first laser source 511 is transmitted through the dichroic filter 72, and the laser beam produced by the second laser source 521 is reflected by the dichroic filter 72, is condensed by the condensing lens 526 via the second beam splitter 524 and is received by the photo detector 525. In this embodiment, the laser beam produced by the first laser source 511 has a wavelength ranging between 400 nanometers and 500 nanometers, and the laser beam produced by the second laser source 521 has a wavelength ranging between 600 nanometers and 800 nanometers. In certain embodiments, as an example, the first laser source 511 produces the laser beam with a wavelength of 405 nanometers and is coupled with the first objective lens 512 with a numerical aperture of 0.85, the second laser source 521 produces a laser beam with a wavelength of 650 nanometers and is coupled with the second objective lens 522 with a numerical aperture of 0.6, and the liquid resin 100 is sensitive to the wavelength of 405 nanometers but not to the wavelength of 650 nanometers.

When the planar scanning module 6 moves the optical pickup head 5 during scanning, vibrations may easily occur. The DOF of the first objective lens 512 with a high numerical aperture would be very shallow, and so the vibrations may cause a converging point of the laser beam to deviate from an intended plane of focus coplanar with the layer of liquid resin 100 intended to be cured. In such circumstances, the detecting unit 52 may be used to correct errors.

As the laser beam produced by the second laser source 521 is reflected by the dichroic filter 72 and received by the photo detector 525 via the second beam splitter 524 and the condensing lens 526, the photo detector 525 may determine whether the converging point of laser beam produced by the second laser source 521 is deviated from the intended plane of focus and make adjustments to the first and second objective lenses 512, 522. Specifically, the photo detector 525 may be connected to a control circuit (not shown) which is further connected to the first and second objective lenses 512, 522 by an actuator (not shown), and may adjusts the first and second objective lenses 512, 522 through the actuator.

In other words, if the converging points of the laser beams deviate from the intended plane of focus due to vibrations, when the photo detector 525 receives the laser beam produced by the second laser source 521 and reflected by the dichroic filter 72 and performs focusing error detection, an error signal is produced and sent to the control circuit. The control circuit then operates the actuator depending on the error signal to adjust the height of the first and second objective lenses 512, 522 such that the converging points of the laser beams are locked on the intended plane of focus, ensuring precision of the curing process.

Figure 9:
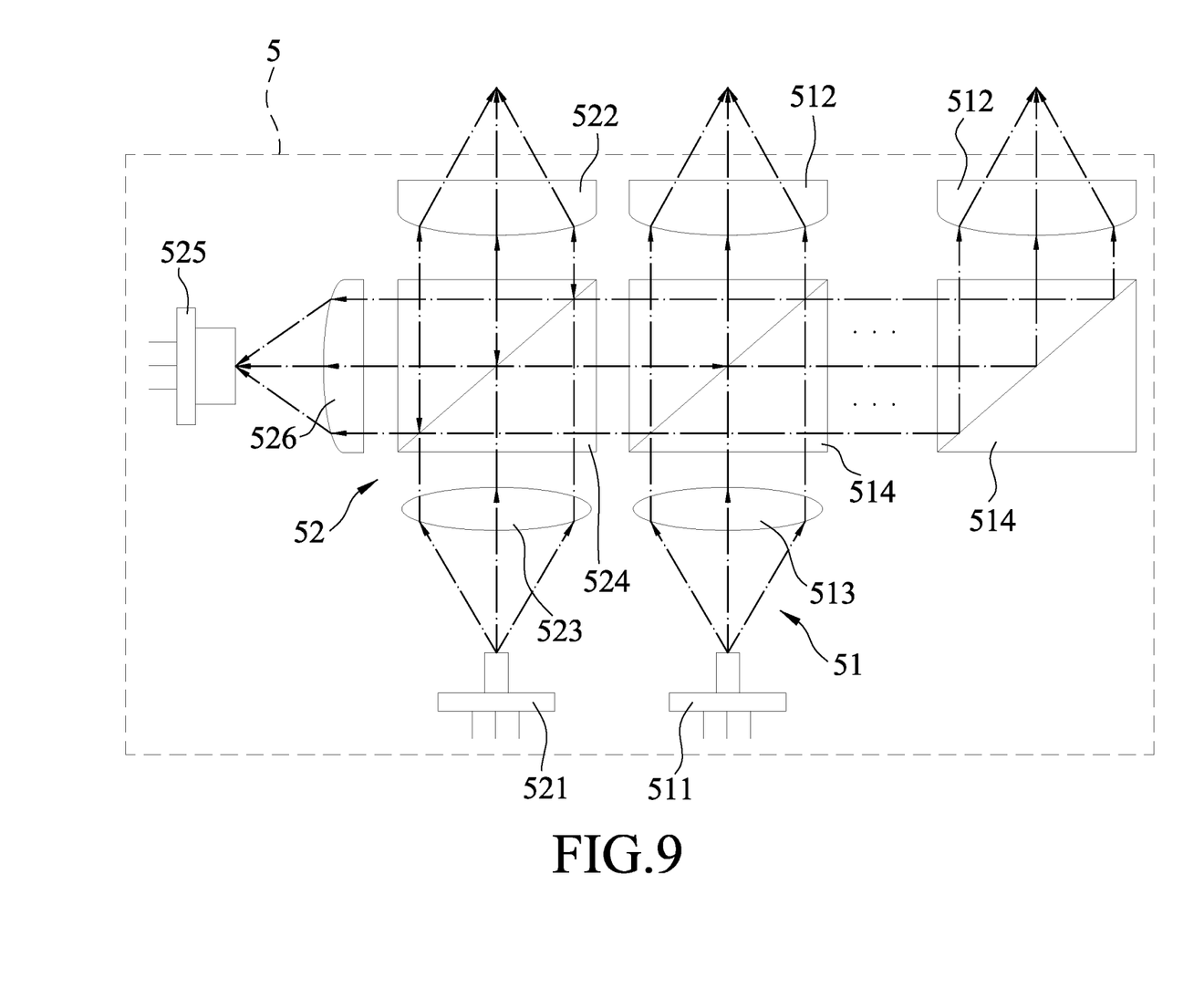
FIG. 9 is a schematic view of the optical pickup head of a fourth embodiment of an additive manufacturing device according to the disclosure.

Referring to FIG. 9, a fourth embodiment of an additive manufacturing apparatus according to the disclosure has a structure similar to that of the third embodiment. The difference between the third embodiment and the fourth embodiment resides in the structure of the focusing unit 51 of the optical pickup head 5. Specifically, the focusing unit 51 includes a plurality of the first objective lenses 512, and a plurality of the first beam splitters 514 aligned respectively with the first objective lenses 512 and disposed between the first collimator lens 513 and the first objective lenses 512. The laser beam produced by the first laser source 511 is split at each first beam splitters 514 and transmits along a plurality of split optical paths to a corresponding one of the first objective lenses 512. As such, the curing of the liquid resin 100 may be done by the plurality of split laser beams simultaneously, shortening the production time of the solid object 101. This method is especially efficient if the solid object 101 has a structure with periodic characteristics. The plurality of laser beams is not limited to being provided using the plurality of beam splitters 514. In other embodiments, the optical pickup head 5 may include a plurality of focusing units 51.

In sum, the additive manufacturing apparatus of the disclosure uses the conventional blue-light optical pickup head as the optical pickup head 5 which has the focusing unit 51 that produces the laser beam having small spot size and works with the planar scanning module 6 to scan in the two-dimensional plane in order to produce the solid object 101 with high resolution. The detecting unit 52 may further be used to detect any deviation of the converging spot of the laser beams produced by the first and second laser sources 511, 521 from the intended plane of focus, upon which the photo detector 525 sends the error signal to the control circuit which operates the height of the first and second objective lenses 512, 522 through the actuator. Moreover, the focusing unit 51 may include multiple first objective lenses 512 and multiple first beam splitters 514, such that multiple laser beams may simultaneously scan and cure the liquid resin 100, decreasing the time needed to produce the solid object 101 and increasing the production speed.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An additive manufacturing apparatus adapted to produce a solid object from a liquid resin, said additive manufacturing apparatus comprising:

a vat adapted for containing the liquid resin;

a lifting platform adapted to be dipped into the liquid resin and to serve as a base on which the solid object is cumulatively formed;

a linear conveying module connected to said lifting platform for moving said lifting platform vertically away from said vat;

an optical pickup head spaced apart from said vat, disposed at a side of said vat opposite to said lifting platform, and including a photo detector and a focusing unit that has
- at least one first laser source for producing a laser beam having a converging point,
- at least one first objective lens spaced apart from said first laser source, and
- a first collimator lens disposed between said first laser source and said at least one first objective lens, such that said laser beam passes through said first collimator lens and said at least one first objective lens to strike the liquid resin and cure the liquid resin during a vertical movement of said lifting platform away from said vat;

a planar scanning module mounted with said optical pickup head and operable to move said optical pickup head on a two-dimensional plane; and a reflector disposed at a bottom of said vat, and including a base and a filter that is disposed on said base, wherein said photo detector is configured to determine whether the converging point of said laser beam is deviated from an intended plane of focus coplanar with a layer of the liquid resin intended to be cured, and to make adjustments to said at least one first objective lens.

2. The additive manufacturing apparatus of claim 1, wherein said at least one first objective lens has a numerical aperture that ranges between 0.1 and 0.85.

3. The additive manufacturing apparatus of claim 1, wherein said laser beam produced by said first laser source has a wavelength that ranges between 400 nanometers and 500 nanometers.

4. The additive manufacturing apparatus of claim 1, wherein said planar scanning module includes two transmission shafts and two transmission motors respectively connected to said two transmission shafts, said two transmission motors being operable to move said two transmission shafts in mutually perpendicular directions, respectively.

5. The additive manufacturing apparatus of claim 1, wherein said planar scanning module includes a rotary platform mounted with said vat, a rotary motor connected to said rotary platform, a transmission shaft mounted with said optical pickup head, and a transmission motor connected to said transmission shaft, said rotary motor being operable to move said rotary platform in an angular direction, said transmission motor being operable to move said transmission shaft in a linear direction.

6. The additive manufacturing apparatus of claim 1, wherein said focusing unit of said optical pickup head includes a plurality of said first objective lenses, and a plurality of first beam splitters aligned respectively with said first objective lenses and disposed between said first collimator lens and said first objective lenses.

7. The additive manufacturing apparatus of claim 1, wherein:
- said filter is a dichroic filter;
- said optical pickup head further includes a detecting unit proximate to said focusing unit and having a second laser source that is for producing a laser beam, a second objective lens that is spaced apart from said second laser source, a second collimator lens that is disposed between said second laser source and said second objective lens, a second beam splitter that is disposed between said second objective lens and said second collimator lens, and a condensing lens that is disposed between said second beam splitter and said photo detector; and
- said laser beams produced by said first and second laser sources have different wavelengths, said laser beam produced by said first laser source is transmitted through said dichroic filter, and said laser beam produced by said second laser source is reflected by said dichroic filter, is condensed by said condensing lens via said second beam splitter, and is received by said photo detector.

8. The additive manufacturing apparatus of claim 7, wherein said laser beam produced by said first laser source has a wavelength ranging between 400 nanometers and 500 nanometers, and said laser beam produced by said second laser source has a wavelength ranging between 600 nanometers and 800 nanometers.

9. The additive manufacturing apparatus of claim 7, wherein said focusing unit of said optical pickup head includes a plurality of said first objective lenses, and a plurality of first beam splitters aligned respectively with said first objective lenses and disposed between said first collimator lens and said first objective lens.

10. The additive manufacturing apparatus of claim 9, wherein said laser beam produced by said first laser source has a wavelength ranging between 400 nanometers and 500 nanometers, and said laser beam produced by said second laser source has a wavelength ranging between 600 nanometers and 800 nanometers.

\* \* \* \* \*

UNITED STATES PATENT AND TRADEMARK OFFICE
CERTIFICATE OF CORRECTION

PATENT NO. : 11,175,588 B2  
APPLICATION NO. : 16/139554  
DATED : November 16, 2021  
INVENTOR(S) : Hsi-Fu Shih Page 1 of 1

It is certified that error appears in the above-identified patent and that said Letters Patent is hereby corrected as shown below:

On the Title Page

The illustrative figure:

Change "

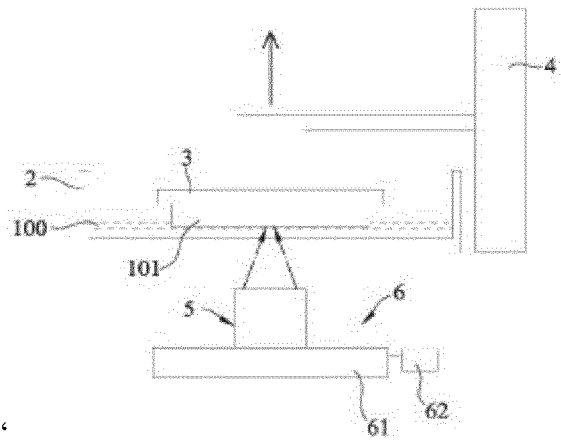

To --

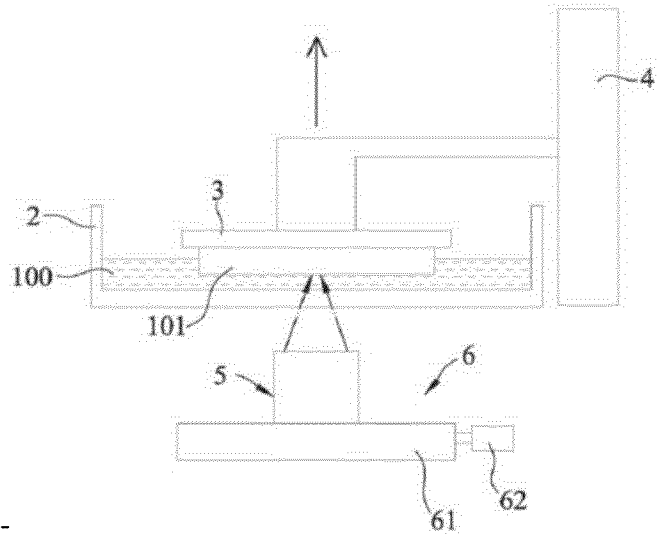

--

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*